(12) United States Patent
Zhang (10) Patent No.: US 8,614,597 B2
(45) Date of Patent: Dec. 24, 2013

(54) HIGH LINEAR VOLTAGE VARIABLE ATTENUATOR (VVA)

(75) Inventor: Wen Hui Zhang, Nashua, NH (US)

(73) Assignee: M/A-COM Technology Solutions Holdings, Inc., Lowell, MA (US)

(*) Notice: Subject to any disclaimer, the term of this patent is extended or adjusted under 35 U.S.C. 154(b) by 81 days.

(21) Appl. No.: 13/161,782

(22) Filed: Jun. 16, 2011

(65) Prior Publication Data

US 2012/0319755 A1 Dec. 20, 2012

(51) Int. Cl.
*H03L 5/00* (2006.01)

(52) U.S. Cl.
USPC .......................................... 327/308; 333/81 R (58) Field of Classification Search
USPC ................................. 327/306, 308; 333/81 R
See application file for complete search history.

(56) References Cited

U.S. PATENT DOCUMENTS

| | | | |
|---|---|---|---|
| 4,890,077 A * | 12/1989 | Sun | 333/81 A |
| 7,138,846 B2 * | 11/2006 | Suwa et al. | 327/308 |
| 7,663,420 B2 * | 2/2010 | Araki et al. | 327/308 |
| 2011/0148501 A1 * | 6/2011 | Granger-Jones et al. | 327/308 |

* cited by examiner

*Primary Examiner* — Dinh T. Le
(74) *Attorney, Agent, or Firm* — Christopher P. Maiorana, PC (57) ABSTRACT

An apparatus comprising one or more series transistor network elements and a plurality of shunt circuits. The series transistor network may be configured to generate an output signal in response to (i) an input signal, (ii) a first bias signal, and (iii) a plurality of variable impedances. The plurality of shunt circuits may each be configured to generate a respective one of the variable impedances in response to a second bias signal. The output signal may have an attenuation that is equal to or less than the input power. The amount of the attenuation may be controlled by the first bias signal and the second bias signal. The series transistor elements and the plurality of shunt circuits may be configured as two or more transistors each having two or more gates.

13 Claims, 7 Drawing Sheets

US 8,614,597 B2
HIGH LINEAR VOLTAGE VARIABLE ATTENUATOR (VVA)

FIELD OF THE INVENTION

The present invention relates to communication circuits generally and, more particularly, to a method and/or apparatus for implementing a high linear voltage variable attenuator (VVA).

BACKGROUND OF THE INVENTION

T or Pi topologies are used in conventional Voltage Variable Attenuators (VVAs). Linearity is determined by each arm of the VVA. Designers often use multi-gate MESFETs or pHEMTs in each arm to improve the power handling and linearity performance. Very frequently, however, this technique is limited by the particular process technology implemented. Certain process technologies only offer a limited number of gates per transistor, thus compromising the ultimate performance of conventional VVAs.

It would be desirable to implement a voltage variable attenuator (VVA) having high linearity using known process technologies.

SUMMARY OF THE INVENTION

The present invention concerns an apparatus comprising a one or more series transistor elements and a plurality of shunt circuits. The series transistor elements may be configured to generate an output signal in response to (i) an input signal, (ii) a first bias signal, and (iii) a plurality of variable impedances. The plurality of shunt circuits may each be configured to generate a respective one of the variable impedances in response to a second bias signal. The output signal may have an attenuation that is equal to or less than the input power. The amount of the attenuation may be controlled by the first bias signal and the second bias signal. The series transistor elements and the plurality of shunt circuits may be configured as two or more transistors each having two or more gates.

The objects, features and advantages of the present invention include implementing a voltage variable attenuator (VVA) that may (i) provide a highly linear output, (ii) implement high power handling, (iii) have low insertion loss and VSWR, (iv) have a low power consumption configuration, (v) comprise low control voltage, (vi) be optimized for system, size and/or cost requirements and/or (vii) be easily implemented.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
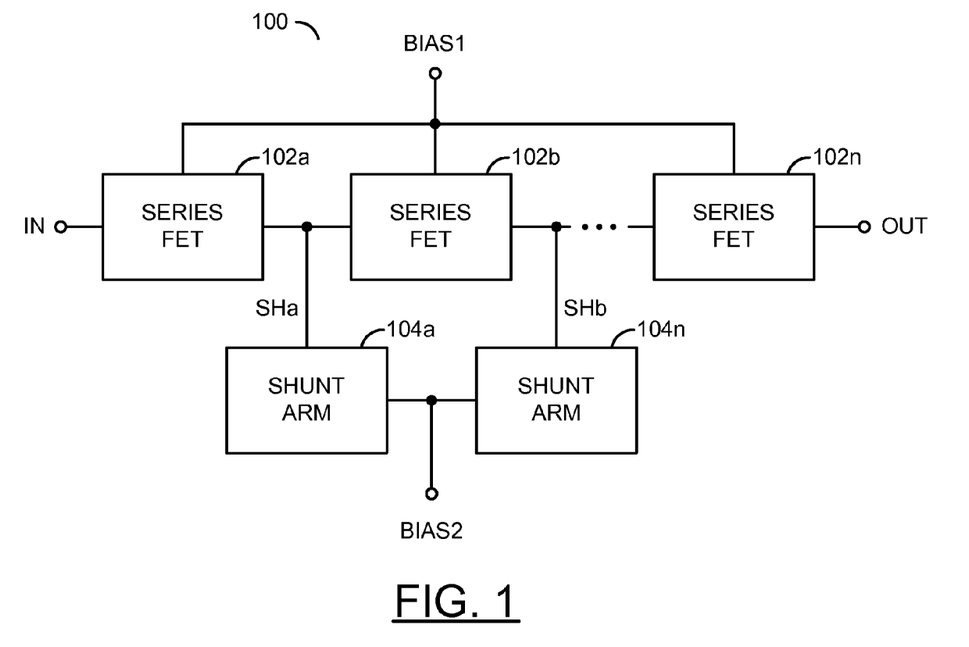
FIG. 1 is a block diagram of an embodiment of the present invention.

Referring to FIG. 1, a block diagram of a system 100 is shown in accordance with a preferred embodiment of the present invention. The system 100 may be implemented as a Voltage Variable Attenuator (VVA). The system 100 illustrates a T configuration. The system 100 generally comprises a plurality of blocks (or circuits) 102a-102n and a plurality of blocks (or circuits) 104a-104n. The blocks 102a-102n may be implemented as series field-effect transistor (FET) circuits. The blocks 102a-102n may collectively comprise a network of series transistor elements (or a series transistor network). The blocks 104a-104n may be implemented as shunt arm circuits. The blocks 102a-102n may each comprise a number of transistors and a number of resistors (to be described in connection with FIGS. 3a-b). The blocks 104a-104b may each comprise a number of transistors (to be described in connection with FIGS. 4a-b).

In one example, the system 100 may comprise a series FET circuit 102a, a series FET circuit 102b, a series FET circuit 102n, a shunt arm circuit 104a, and a shunt arm circuit 104n. The particular number of circuits 102a-102n and the particular number of circuits 104a-104n may be varied to meet the design criteria of a particular implementation. The circuits 102a-102n may each comprise a series transistor network. The series transistor network circuits 102a-102n may receive a signal (e.g., IN) and may present a signal (e.g., OUT). Each circuit in the series transistor network (e.g., the circuit 102a, the circuit 102b, and the circuit 102c) may receive a signal (e.g., BIAS1). The signal BIAS1 may be a bias voltage. The signal BIAS1 may control the amount of attenuation provided by the circuits 102a-102n. The shunt arm circuits (e.g., the circuit 104a and the circuit 104b) may each receive a signal (e.g., BIAS2). The signal BIAS2 may be a bias voltage. The signal BIAS2 may control the amount of attenuation provided by the circuits 104a-104n.

Each of the shunt arm circuits 104a-104b may present an impedance (e.g., SH) to the network of series transistor elements 102a-102c. For example, the circuit 104a may present an impedance SHa to the series transistor network 102a-102n. The circuit 104n may present an impedance SHn to the series transistor network 102a-102n. The impedances SHa-SHn may be variable impedances. In general, the shunt arm circuits 104a-104n may be implemented as stacked multi-gate FET transistors. The FET transistors normally behave like a variable resistor and/or capacitor in parallel, controlled by the voltage signal BIAS2. When the gate to source voltage Vgs=0V, is very small (e.g., ranging from 0.5 ohm to 3 ohms, or more) the impedance value is almost equivalent to a short circuit. When the gate to source voltage Vgs=−3V or lower, the impedance value is almost equivalent to a capacitor, similar to an open circuit. When one of the shunt arms 104a-104n implements a short circuit, the input signal IN will normally have higher attenuation. When one of the shunt circuits 104a-104n operates as an open circuit, the input signal IN will normally have a lower attenuation.

The signal OUT may have a voltage that is equal to or less than the signal IN. For example, the signal IN may be a data signal having an amplitude that ranges up to a maximum value (e.g., X). The signal OUT may be a version of the data signal having an attenuator maximum value (e.g., 90% X), where 90% is the amount of attenuation.

The amount of attenuation may be controlled by the signal BIAS1 and/or the signal BIAS2. The signal BIAS1 and/or the signal BIAS2 may be varied to attenuate the signal IN. The signal BIAS1 and the signal BIAS2 may be voltages that are selected independently, or may be voltages that are complementary. In one example, when the series transistor network 102a-102n is ON, the circuits 104a-104n are OFF. The signal BIAS1 and/or the signal BIAS2 may control the amount of attenuation when the series transistor network 102a-102n and the circuits 104a-104n are both partially ON. In general, the signal BIAS1 and the signal BIAS2 may be implemented as analog control voltages. For example, the signal BIAS1 and/or the signal BIAS2 may be applied without regard to fixed increments generally associated with digital control bits. While analog voltages have been described, finely tuned digital voltages may also be implemented. In one example, the signal BIAS1 may vary between 0V and −3V (e.g., for a 0V gate to source (VGS) voltage). As the signal BIAS2 transitions from 0 v to −3 v, the voltage VGS transitions from −3 v to 0 v. Other voltage ranges may be implemented to operate with other process technologies.

The system 100 may be implemented in a communication system to control Radio Frequency (RF) and/or microwave signal levels. In one example, the system 100 may be implemented using GaAs devices to obtain low parasitics, simple bias networks, and/or low power consumption. For example, the system 100 may implement InGaAs/GaAs pHEMT and/or MESFET technologies for monolithic microwave integrated circuits (MMICs) and/or Radio Frequency Integrated Circuits (RFICs). The particular type of semiconductor devices used may be varied to meet the design criteria of a particular implementation.

The circuits 102a-102n and/or the circuits 104a-104n may comprise a plurality of stacked transistors. In one example, the stacked transistors may be MESFETs. In another example, the stacked transistors may be pHEMTs. However, the particular type of transistor implemented may be varied to meet the design criteria of a particular implementation. The stacked transistors may minimize harmonics and/or distortions, such that performance will not be limited by the particular MMIC and/or RFIC process used.

The number of the stacked transistors may be determined according to a number of system design targets and/or specifications. System specifications may include one or more of (i) input power, (ii) output impedance, (iii) pinch off voltage of a transistor, (iv) high and low control voltage, and/or (v) the junction voltage of the transistor. The size of each transistor may be determined by one or more saturation current specifications. In one example, the system 100 may function in ON and OFF states of the transistors (e.g., a digital mode). In another example, the circuit 100 may function in one or more transitional states of the transistors between ON to OFF or from OFF to ON (e.g., an analog mode). The linearity analysis of the system 100 may be determined by using advanced design tools with large signal simulation and/or accurate device models. The circuit characteristics of the system 100 (e.g., L, S, C, X and/or Ku band VVAs) may be optimized for system, size and/or cost requirements.

Figure 2:
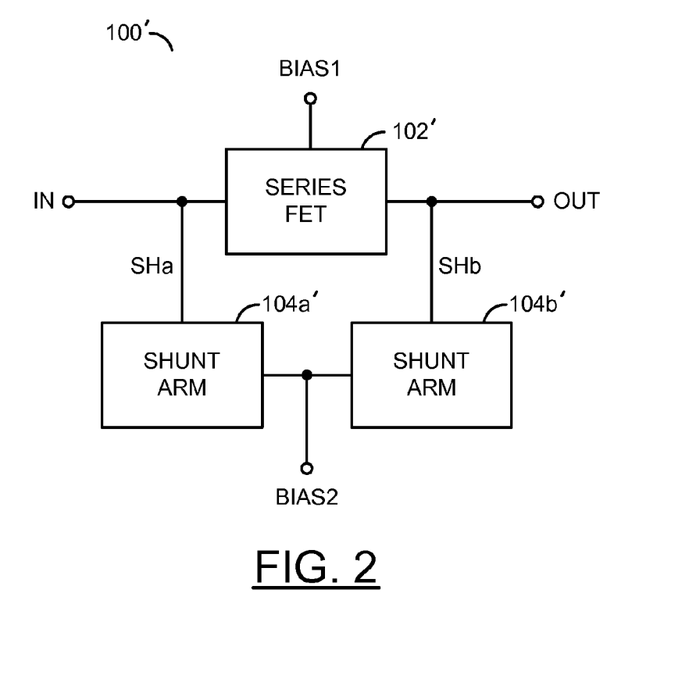
FIG. 2 is a block diagram of an alternate embodiment of the present invention.

Referring to FIG. 2, a block diagram of a system 100' is shown in accordance with an alternate embodiment of the present invention. The system 100' illustrates a Pi configuration. In one example, the system 100' may comprise a series FET circuit 102', a shunt arm circuit 104a', and a shunt arm circuit 104b'. The circuit 102' and the circuits 104a'-104b' may be implemented similarly to the circuits 102a-102n and/or the circuits 104a-104n in the system 100.

Figure 3A:
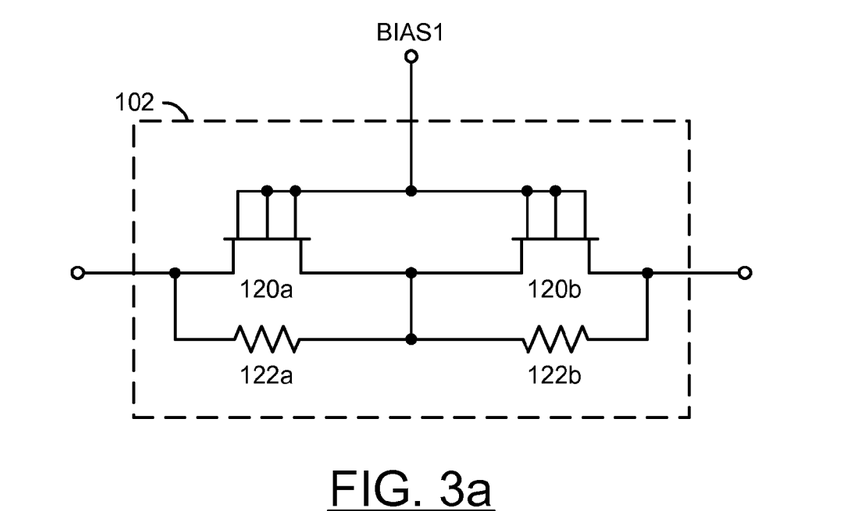
FIG. 3a is a more detailed description of a series FET circuit.

Referring to FIG. 3a, a more detailed diagram of the circuit 102 (or 102') is shown. The circuit 102 may comprise a transistor 120a, a transistor 120b, a resistor 122a, and a resistor 122b. The particular number of transistors and/or resistors may be varied to meet the design criteria of a particular implementation. In one example, the transistor 120a and the transistor 120b may be implemented as FET transistors. However, the particular type of transistor implemented may be implemented to meet the design criteria of a particular implementation. The transistor 120a and/or the transistor 120b may each be implemented with three gates. However, the particular number of gates may be varied (e.g., increased or decreased) to meet the design criteria of a particular implementation. The signal BIAS1 may be presented to each gate of the transistor 120a and/or the transistor 120b. The source of the transistor 120a may be connected to a first node. The drain of the transistor 120a may be connected to the source of the transistor 120b. The drain of the transistor 120b may be connected to a second node.

Figure 3B:
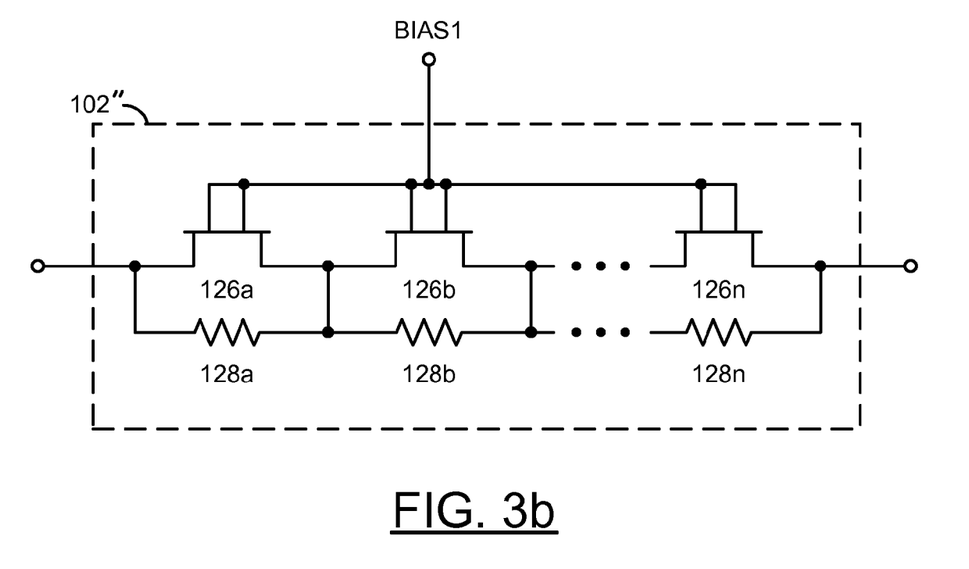
FIG. 3b is an alternate embodiment of the series FET circuit.

Referring to FIG. 3b, a circuit 102" illustrating an alternate embodiment of the circuit 102 (or 102') is shown. The circuit 102" is shown comprising a plurality of transistors 126a-126n and a plurality of resistors 128a-128n. The transistors 126a-126n may each comprise two gates. The signal BIAS1 may be presented to each gate of the transistors 126a-126n.

Figure 4A:
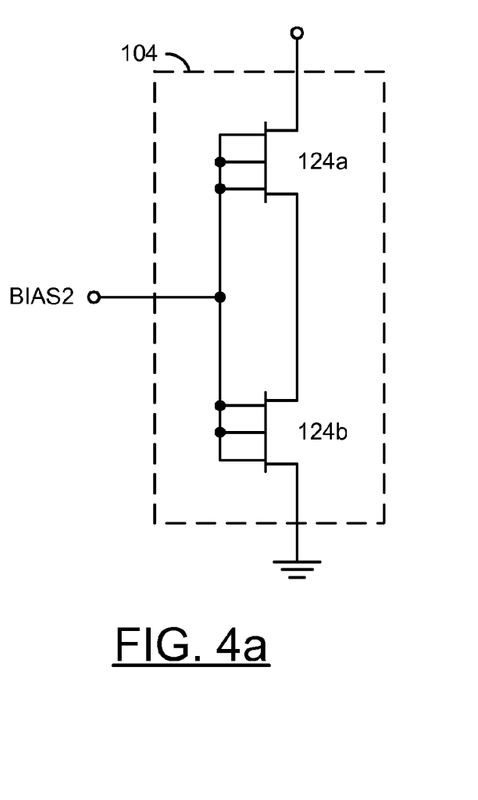
FIG. 4a is a more detailed description of a shunt arm circuit.

Referring to FIG. 4a, a more detailed description of the circuit 104 (or 104') is shown. The circuit 104 may comprise a transistor 124a and a transistor 124b. The particular number of transistors may be varied to meet the design criteria of a particular implementation. In one example, the transistor 124a and the transistor 124b may be implemented as FET transistors. However, the particular type of transistor implemented may be varied to meet the design criteria of a particular implementation. The transistor 124a and the transistor 124b may each comprise three gates. However, the number of gates may be varied to meet the design criteria of a particular implementation. The signal BIAS2 may be presented to each gate of the transistor 124a and the transistor 124b. The drain of the transistor 124a may be connected to a first node. The source of the transistor 124a may be connected to the drain of the transistor 124b. The source of the transistor 124b may be connected to ground.

Figure 4B:
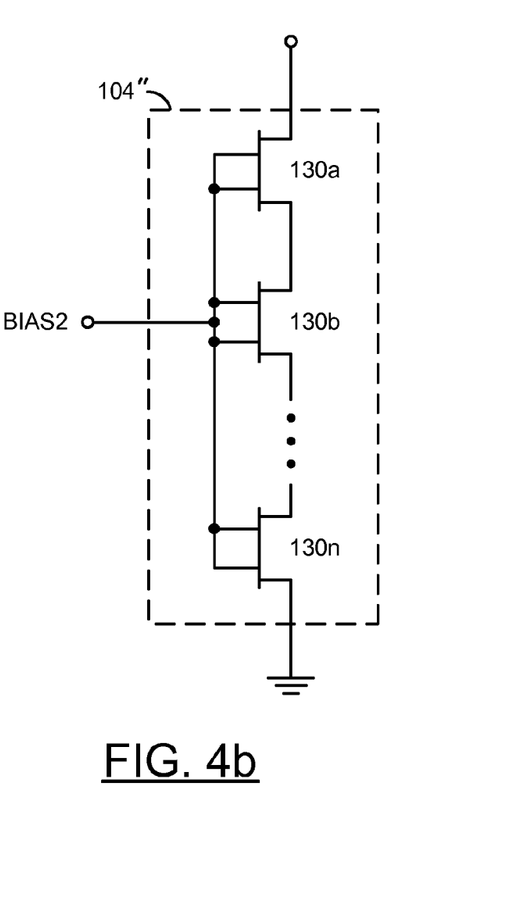
FIG. 4b is an alternate embodiment of the shunt arm circuit.

Referring to FIG. 4b, a circuit 104" illustrating an alternate embodiment of the circuit 104 (or 104') is shown. The circuit 104' may comprise a plurality of transistors 130a-130n. The transistors 130a-130n may each comprise two gates. The signal BIAS2 may be presented to each gate of the transistors 130a-130n.

Figure 5:
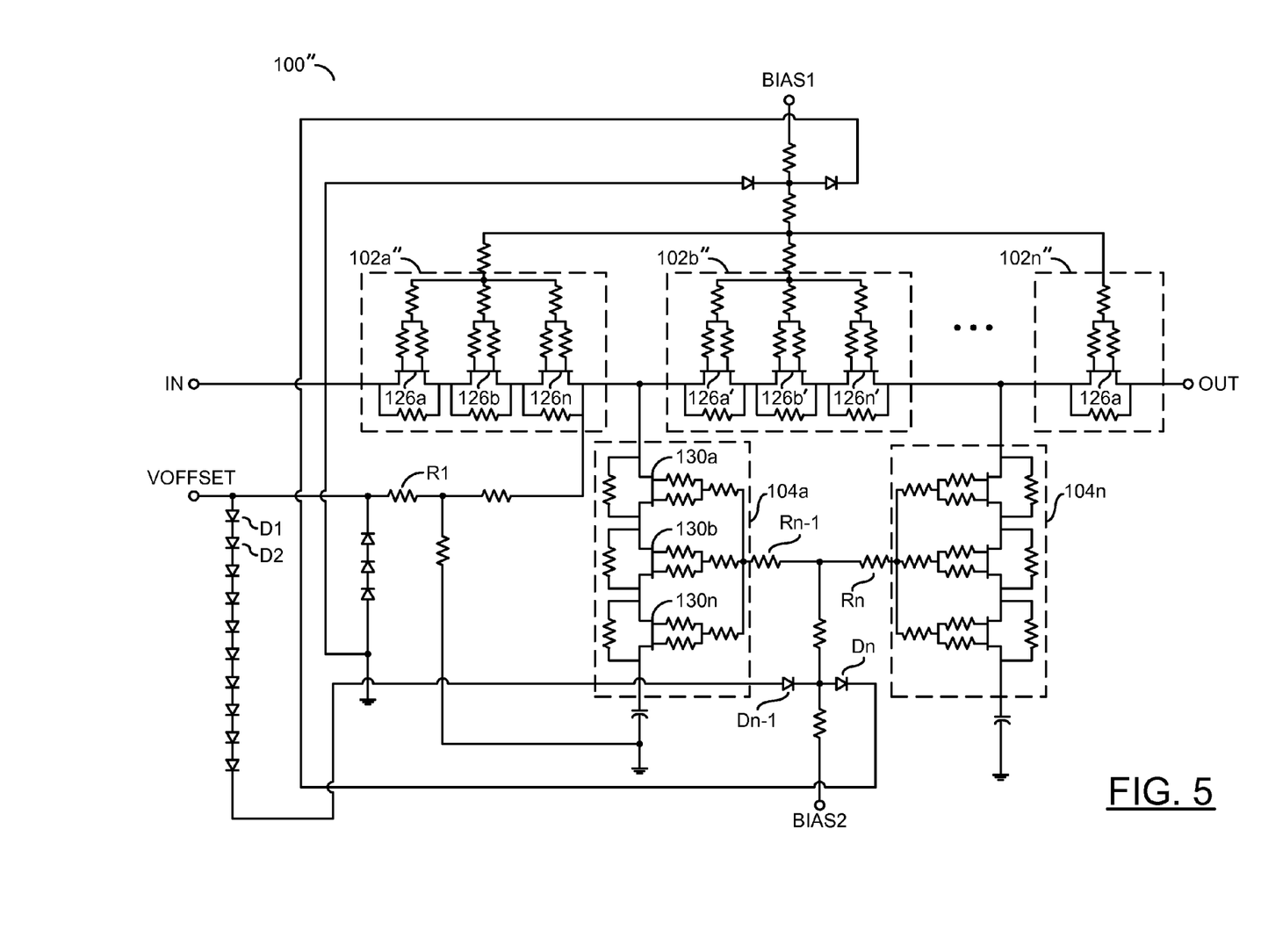
FIG. 5 is a diagram of a circuit used to generate simulations of an example of the present invention.

Referring to FIG. 5, a diagram of a circuit 100" is shown. The circuit 100" provides details that may be used for simulations shown in FIGS. 7a and 7b. A number of diodes D1-Dn are shown through the circuit 100'. The diodes D1-Dn provide interconnections that may be used to provide electrostatic discharge protection. Similarly, a number of resistors R1-Rn are shown providing similar interconnections. The particular number and/or configuration of the diodes D1-Dn and/or the resistors R1-Rn may be varied to meet the design criteria of a particular implementation. The circuit 102a" is shown comprising a simulation of the circuit 126a-n. The circuit 102n" is shown with a single transistor 126a. A determination whether each of the circuits 102a"-102n" are implemented with a single transistor, or two or more transistors, may be determined and modified to meet the design criteria of a particular implementation.

Figure 6:
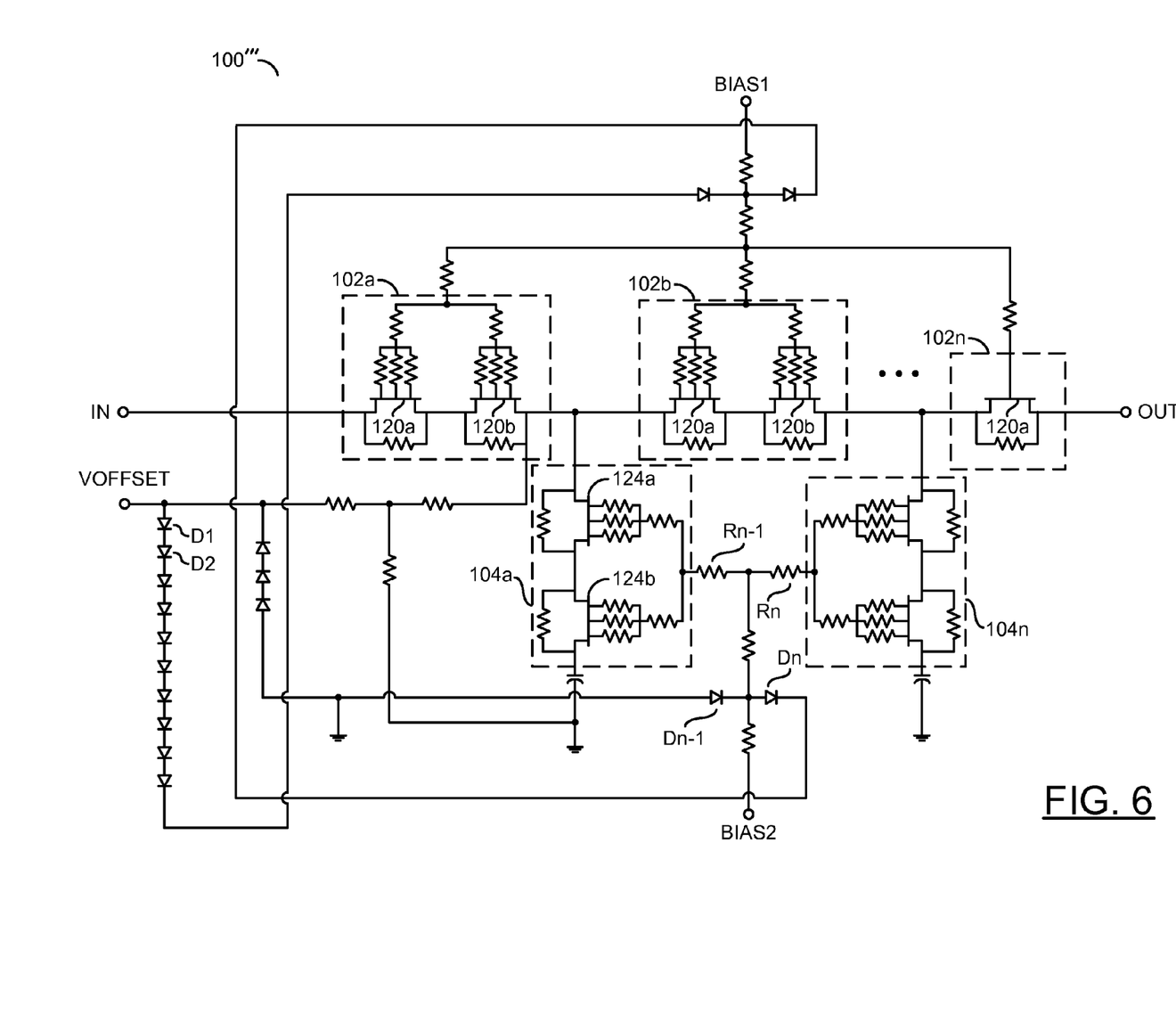
FIG. 6 is a diagram of a circuit used to generate simulations of an example of the present invention.

Referring to FIG. 6, a diagram of a circuit 100''' is shown. The circuit 100''' may be used to provide the simulation shown in FIGS. 8a and 8b. The circuit 100''' has similar diodes D1-Dn and resistors R1-Rn as the circuit 100''. The circuit 102a is shown implemented with two transistors 120a and 120b. The circuit 102n is shown implemented with one transistor 120a. The transistors 120a-120b are shown as triple gate transistors. By implementing two transistors 120a-120b each with three gates, a sixth gate circuit 102a may be implemented. Additionally, the circuit 102n is shown with a single gate single transistor 120a. By varying the number of gates and/or transistors 120a and 120b and the circuits 102a-102n, the design target parameters of the particular implementation may be varied.

Figure 7A:
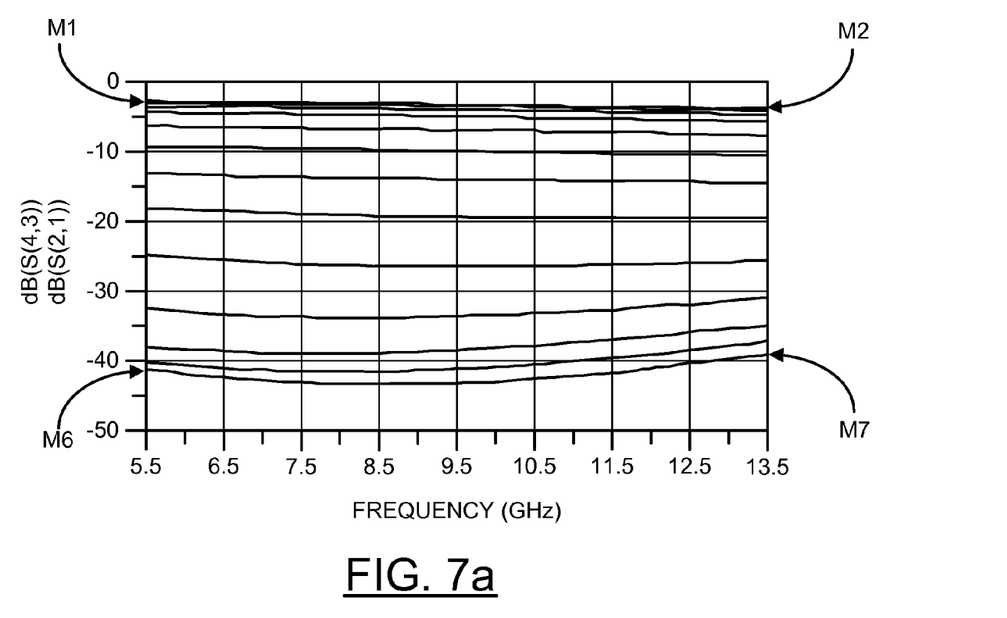
FIGS. 7a and 7b are diagrams illustrating simulations of the circuit of FIG. 5.
Figure 7B:
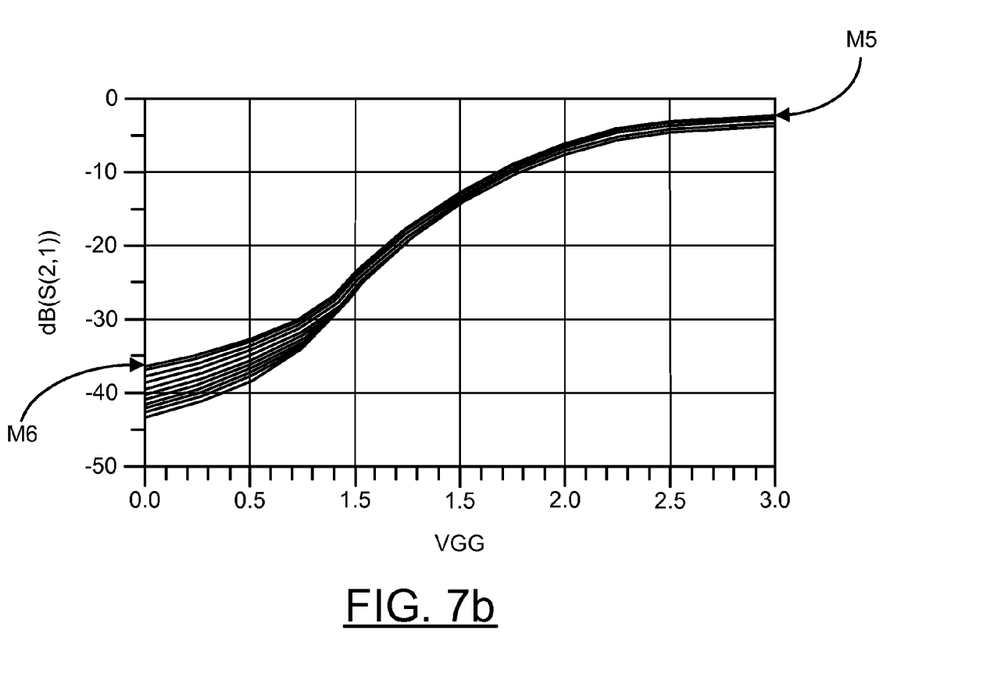

Referring to FIGS. 7a and 7b, simulations of the circuit 100'' are shown. FIG. 7a shows an insertion loss (in dB) and an attenuation (in dB). FIG. 7a shows the following example results:

| m1 |
| --- |
| freq = 5.500 GHz |
| dB(S(2.1)) = −2.575 |
| Vgg + 3.000000 |

| m2 |
| --- |
| freq = 13.50 GHz |
| dB(S(4.3)) = −3.635 |
| Vgg = 0.000000 |

| m6 |
| --- |
| freq = 5.500 GHz |
| dB(S(2.1)) = −41.211 |
| Vgg = 0.000000 |

| m7 |
| --- |
| freq = 13.50 GHz |
| dB(S(4.3)) = −39.022 |
| Vgg = 3.000000 |

FIG. 7b illustrates an insertion loss of less than 3.7 dB. An attenuation range is shown as higher than 35 dB. FIG. 7b shows the following example results:

| m5 |
| --- |
| indep(m5) = 3.000 |
| plot_vs(dB(S(2.1)), Vgg) = −3.867 |
| freq = 15.00000 GHz |

| m6 |
| --- |
| indep(m6) = 0.000 |
| plot_vs(dB(S(2.1)), Vgg = −Vgg) = −36.698 |
| freq = 15.00000 GHz |

Figure 8A:
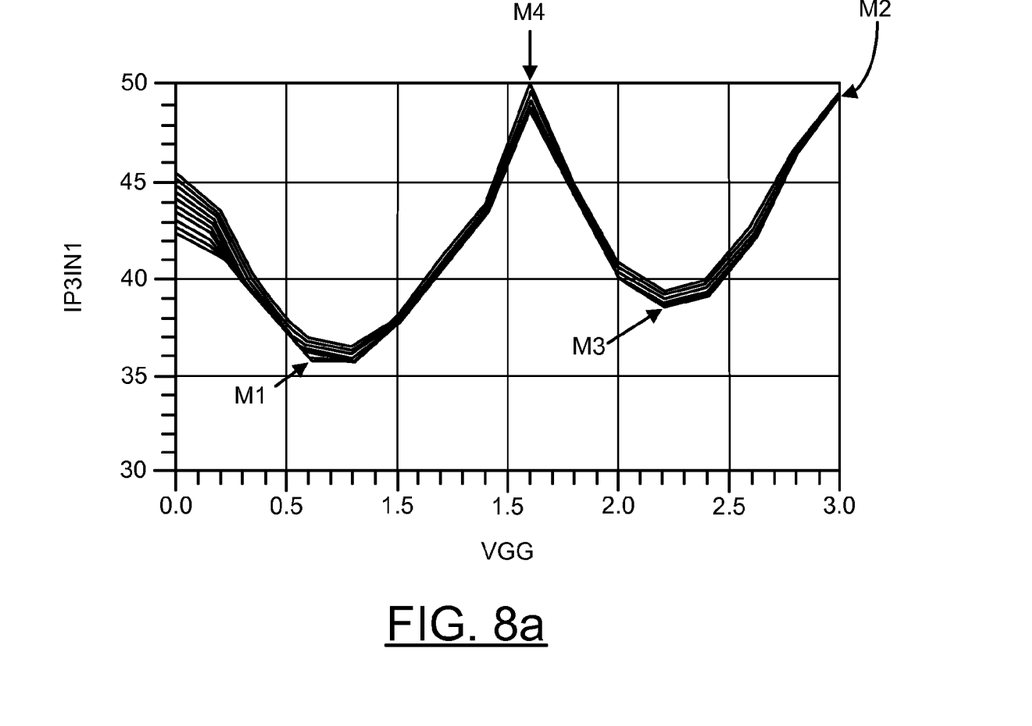
FIGS. 8a and 8b are diagrams showing simulations of the circuit of FIG. 6.
Figure 8B:
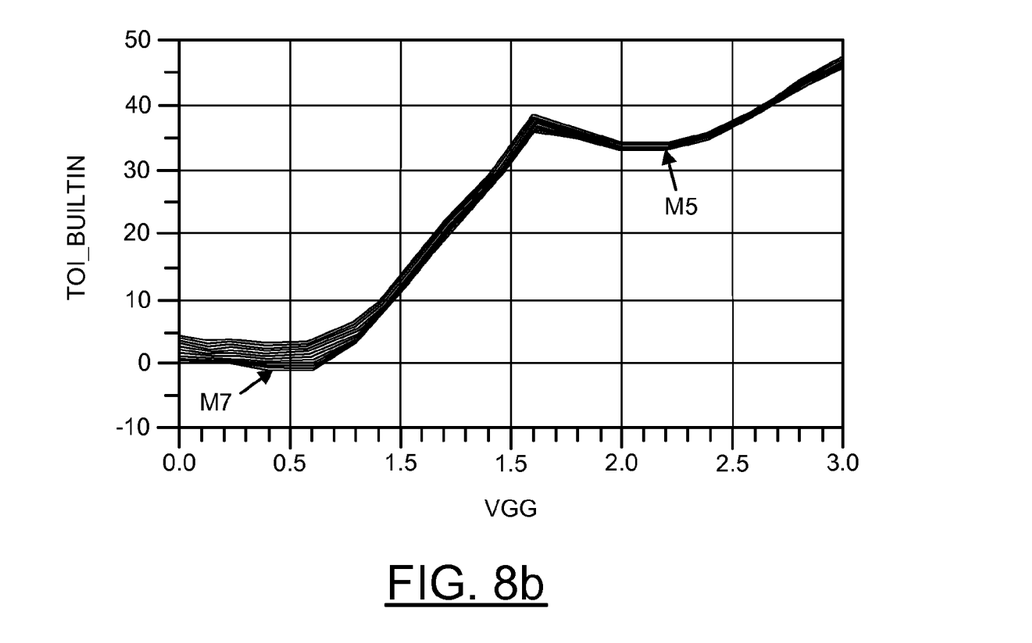

Referring to FIGS. 8a and 8b, simulations of the circuit 100''' are shown. FIGS. 8a and 8b show an input third-order Inter-Modulation (IIP3) and products (dB). IIP3 is shown as more than 35.5 dBm over the 5.5 to 13.5 GHz. An OIP3 is equal to IIP3-attenuation.

FIG. 8a shows the following example results:

| m1 |
| --- |
| indep(m1) = 0.600 |
| plot_vs(IP3in1, Vgg) = 35.755 |
| RF = 5.5000000E9 |

| m2 |
| --- |
| indep(m2) = 3.000 |
| plot_vs(IP3in1, Vgg) = 49.506 |
| RF = 1.350000E10 |

| m3 |
| --- |
| indep(m3) = 2.200 |
| plot_vs(IP3in1, Vgg) = 35.755 |
| RF = 5.500000E9 |

| m4 |
| --- |
| indep(m4) = 1.600 |
| plot_vs(IP3in1, Vgg) = 49.939 |
| RF = 8.900000E9 |

FIG. 8b shows the following example results:

| m5 |
| --- |
| indep(m5) = 2.200 |
| plot_vs(TOI_builtin, Vgg) = 33.521 |
| RF = 1.350000E10 |

| m7 |
| --- |
| indep(m7) = 0.400 |
| plot_vs(TOI_builtin, Vgg) = −0.803 |
| RF = 7.700000E9 |

The various signals of the present invention are generally "on" (e.g., a digital HIGH, or 1) or "off" (e.g., a digital LOW, or 0). However, the particular polarities of the on (e.g.,

The invention claimed is:

1. An apparatus comprising:
   two or more series transistor elements configured to generate an output signal in response to (i) an input signal, (ii) a first bias signal, and (iii) a plurality of variable impedances;
   a plurality of shunt circuits each configured to generate a respective one of said variable impedances in response to a second bias signal, wherein (i) said output signal is attenuated compared with said input signal by an attenuation value, (ii) said output signal has an output power equal to or less than an input power of said input signal, (iii) an amount of said attenuation value is controlled by said first bias signal and said second bias signal, and (iv) one or more of said series transistor elements and each of said plurality of shunt circuits are configured as two or more transistors each having two or more gates; and
   a plurality of resistors driven by a third bias signal and configured to generate a respective DC voltage at each drain and each source of said transistors.

2. The apparatus according to claim 1, wherein said series transistor elements comprises one or more sets of said two or more transistors in a stacked configuration.

3. The apparatus according to claim 1, wherein said series transistor elements generate said output signal in response to two or more shunt impedances.

4. The apparatus according to claim 1, wherein a corresponding one of said resistors is connected between said source and said drain of each of said transistors.

5. The apparatus according to claim 1, wherein each of said plurality of shunt circuits comprises said two or more transistors in a stacked configuration.

6. The apparatus according to claim 1, wherein said first bias signal is presented to said gates of said series transistor elements.

7. The apparatus according to claim 1, wherein said second bias signal is presented to said gates of said plurality of shunt circuits.

8. The apparatus according to claim 1, wherein said series transistor elements comprises (i) two of said series transistor elements having said two or more transistors and (ii) a third of said series transistor elements having a single one of said transistors.

9. The apparatus according to claim 1, wherein said apparatus is implemented as a Voltage Variable Attenuator (VVA).

10. The apparatus according to claim 1, wherein said first bias signal and said second bias signal are analog bias signals that adjust independently of each other.

11. The apparatus according to claim 1, wherein said apparatus operates in a microwave signal range.

12. An apparatus comprising:
    means for generating an output signal in response to (i) an input signal, (ii) a first bias signal, and (iii) a plurality of variable impedances,
    means for generating a respective one of said variable impedances in response to a second bias signal, wherein (i) said output signal is attenuated compared with said input signal by an attenuation value, (ii) said output signal has an output power equal to or less than an input power of said input signal,
    (iii) an amount of said attenuation value is controlled by said first bias signal and said second bias signal, and (iv) one or more of said means for generating said output signal and each of said means for generating said respective variable impedances are configured as two or more transistors each having two or more gates; and
    means for generating a respective DC voltage at each drain and each source of said transistors through a plurality of resistors driven by a third bias signal.

13. A method for providing a voltage variable attenuator, comprising the steps of:
    (A) generating an output signal in response to (i) an input signal, (ii) a first bias signal, and (iii) a plurality of variable impedances;
    (B) generating a respective one of said variable impedances in response to a second bias signal, wherein (i) said output signal is attenuated compared with said input signal by an attenuation value, (ii) said output signal has an output power equal to or less than an input power of aid input signal, (iii) an amount of said attenuation value is controlled by said first bias signal and said second bias signal, and (iv) one or more series transistor elements implementing step (A) and each of a plurality of shunt circuits implementing step (B) are configured as two or more transistors each having two or more gates; and
    (C) generating a respective DC voltage at each drain and each source of said transistors through a plurality of resistors driven by a third bias signal.

* * * * *